United States Patent
Lin et al.

(10) Patent No.: US 7,502,267 B2
(45) Date of Patent: Mar. 10, 2009

(54) CLOCK FREQUENCY DOUBLER METHOD AND APPARATUS FOR SERIAL FLASH TESTING

(75) Inventors: Tien-Ler Lin, Saratoga, CA (US);
Kwangho Kim, Pleasanton, CA (US);
Hui Chen, Santa Clara, CA (US);
Eungjoon Park, Fremont, CA (US)

(73) Assignee: Winbond Electronics Corporation, Hsinchu, Taiwan (CN)

( * ) Notice: Subject to any disclaimer, the term of this patent is extended or adjusted under 35 U.S.C. 154(b) by 80 days.

(21) Appl. No.: 11/526,124

(22) Filed: Sep. 22, 2006

(65) Prior Publication Data
US 2008/0080276 A1   Apr. 3, 2008

(51) Int. Cl.
*G11C 7/00* (2006.01)
*G11C 11/34* (2006.01)
*G11C 8/00* (2006.01)

(52) U.S. Cl. ............ 365/201; 365/185.29; 365/185.33; 365/233.1; 365/233.11; 365/233.12

(58) Field of Classification Search ........... 365/201, 365/233, 185.22, 185.29, 185.33, 233.1, 365/233.11, 233.12
See application file for complete search history.

(56) References Cited

U.S. PATENT DOCUMENTS

| | | | |
|---|---|---|---|
| 5,619,463 A * | 4/1997 | Malhi | 365/201 |
| 6,226,764 B1 * | 5/2001 | Lee | 365/201 |
| 6,349,065 B1 * | 2/2002 | Ooishi | 365/201 |
| 6,404,684 B2 * | 6/2002 | Arimoto et al. | 365/201 |
| 6,438,048 B1 * | 8/2002 | Kumar | 365/201 |
| 6,570,791 B2 | 5/2003 | Roohparvar et al. | |
| 6,741,497 B2 | 5/2004 | Roohparvar et al. | |
| 6,744,272 B2 * | 6/2004 | Ernst et al. | 365/201 |
| 6,845,057 B2 | 1/2005 | Widmer et al. | |
| 6,980,453 B2 | 12/2005 | Roohparvar et al. | |
| 2004/0243872 A1 * | 12/2004 | Tu et al. | |

* cited by examiner

*Primary Examiner*—Trong Phan
(74) *Attorney, Agent, or Firm*—Townsend and Townsend and Crew LLP

(57) ABSTRACT

Method and apparatus for memory device testing at a higher clock rate than the clock rate provided by a memory tester. The method includes providing a memory tester capable of generating a first clock signal characterized by a first clock frequency, and applying the first clock signal to the memory device. The method also includes receiving a command for activating a high-clock-frequency test mode. The method generates a second clock signal in the memory device in response to the first clock signal. The second clock signal is characterized by a second clock frequency which is higher than the first clock frequency. The method then tests the memory device at the second clock frequency. In a specific embodiment, the method is applied to a serial flash memory device. The invention can also be applied to testing and operating other memory devices or systems that include synchronized circuits.

19 Claims, 8 Drawing Sheets

CLOCK FREQUENCY DOUBLER METHOD AND APPARATUS FOR SERIAL FLASH TESTING

BACKGROUND OF THE INVENTION

The present invention is directed to integrated circuits and their design for the manufacture of semiconductor devices. More particularly, this invention provides a method and apparatus for memory device testing at a higher clock rate than the clock rate provided by a memory tester. Merely by way of example, the invention has been applied to serial flash memory devices for the manufacture of integrated circuits. But it would be recognized that the invention has a much broader range of applicability. For example, the invention can be applied to other memory devices such DRAM, SRAM, parallel flash, or other non-volatile memories. The invention can also be applied to systems that include synchronized circuits.

Flash memories are used in a variety of applications in electronics. These memories can retain data without the need for a power supply, and they are used for data and code storage in many applications, such as cell phones, digital cameras, personal digital assistants, desktop and notebook computers, computer peripherals, TV/entertainment systems, combinations of these, among others. As integrated circuit technologies continue to advance, the size and density of flash memory devices have also been growing. These flash memory devices often include a large number of input and out pins to accommodate data and addresses required to access the memory cells. In response to increasing space and wiring demands, a class of flash memory devices called serial flash memories has been developed to provide reduced pin counts, often requiring only one or two data pins. These serial flash memories provide a storage solution for systems with limited space, pin connections, and power supplies. Serial flash memories can be used for code download applications, as well as for storage of voice, text, and data, etc.

Increasing circuit density has not only improved the complexity and performance of ICs but has also increased the cost of testing. Testing flash memory devices is especially expensive, in part because programming and erase of the non-volatile memory cells are time-consuming. Serial flash memory devices are often limited by one or two data pins and, therefore, require high speed testing to avoid long testing time. In addition, in certain applications, serial flash memory devices are often sold in die form as so-called "known good die" or KGD. In such applications, the memory devices are tested at wafer level without the benefit of chip packaging, and it is difficult to test serial flash memory devices thoroughly at their operating speed. As is known, high speed memory testers are expensive and are often operated in a multi-channel configuration in which many memory devices are tested simultaneously in a tester during wafer level or packaged device testing. Often the tester and hardware setup such as load board are not configured to provide clock signals at frequencies as high as the operating clock frequencies of the memory devices. This can lead to inadequate testing of the memory devices and failed parts in the final products. These and other limitations are described throughout the present specification and more particularly below.

From the above, it is seen that an improved technique for testing and design of semiconductor memory devices is desired.

BRIEF SUMMARY OF THE INVENTION

According to the present invention, techniques directed to integrated circuit memory testing and design are provided. More particularly, the invention provides a method and apparatus for memory device testing at a higher clock rate than the clock rate provided by a memory tester. Merely by way of example, the invention has been applied to serial flash memory devices for the manufacture of integrated circuits. But it would be recognized that the invention has a much broader range of applicability. For example, the invention can be applied to other memory devices such DRAM, SRAM, parallel flash, or other non-volatile memories. The invention can also be applied to systems that include synchronized circuits.

In a specific embodiment, the invention provides a method for wafer-level testing of serial flash memory devices. The method includes providing a memory tester operable in a certain predetermined clock frequency range. In an embodiment, for example, the frequency can range from 30 to 100 MHz. Depending upon the embodiments, the memory test can operate in a much higher frequency range. The method includes providing a semiconductor wafer which includes a first plurality of serial flash memory devices. Depending upon the applications, a semiconductor wafer can include hundreds of serial flash memory devices. The memory devices can include bonding pads for accessing the internal circuit of the memory devices. The method includes selecting a second plurality of serial flash memory devices from the first plurality of serial flash memory devices. In certain embodiments, the selected memory devices are accessed by a load board which includes probes for contacting the bonding pads in the memory devices. The method includes subjecting one or more of the second plurality of serial flash memory devices to a first clock signal from the memory tester. In certain embodiments, the tester is capable of generating a clock in the frequency range from 30 to 100 MHz. The method also includes receiving a command signal at a bonding pad from the plurality of bonding pads from one of the second plurality of serial flash memory devices for activating a high-clock-frequency test mode. The method includes generating a second clock signal in each one of the second plurality of memory devices in response to the first clock signal. In a specific embodiment, the second clock signal is characterized by a second clock frequency higher than the first clock frequency. In some embodiment, the second clock frequency is a multiple of the first clock frequency. In certain embodiments, the second clock frequency is in the range of 60 to 200 MHz. In a specific embodiment, the first clock frequency is 40 MHz and the second clock frequency is 80 MHz. In a specific embodiment, the generating of the second clock signal includes receiving a third clock signal from the memory tester, which is characterized by the first clock frequency, but includes a ¼ cycle phase shift with respect to the first clock signal. The method then couples the first and third clock signals to an EXCLUSIVE-OR circuit, which configured for generating the second clock signal. The second clock signal thus generated is characterized by a clock frequency that is twice the first clock frequency. The method also includes testing the second plurality of memory devices at the second clock frequency. In an embodiment, the testing of the second plurality of serial flash memory device may include the following operations:

a. programming data patterns into memory cells of each of the second plurality of serial flash memory devices;
b. reading the memory cells to verify the data patterns;
c. erasing the memory cells in each of the second plurality of serial flash memory devices; and
d. issuing commands to the memory device to verify user mode and test mode operations, etc.

In a specific embodiment, the invention provides a method for testing a memory device. The method includes providing a memory tester capable of generating a first clock signal characterized by a first clock frequency. In a specific embodiment, the memory tester often is not capable of supplying a clock signal at a high operating frequency of the memory devices. The method includes applying the first clock signal to the memory device and receiving a command for activating a high-clock-frequency test mode. The method generates a second clock signal in the memory device in response to the first clock signal. The second clock signal is characterized by a second clock frequency higher than the first clock frequency. In a specific embodiment, the second clock signal can be chosen to be at an operating clock frequency required to test the memory device. The method then tests the memory device at the second clock frequency.

In a specific embodiment, the method is applied to testing a serial flash memory device. That is, the memory device under test is a serial flash memory device. In other embodiments, the method can be applied to testing other memory devices. In an embodiment, the receiving of a command for activating a high-clock-frequency test mode further includes receiving a high voltage signal at an input pin. The high voltage signal is characterized by a voltage substantially higher than an operating voltage of the memory device. For example, in an embodiment, a memory device can be operated at 3.3 volts, whereas a 10 volts signal may be required to activate a special test mode. In a specific embodiment, the method then sets the memory device in a test mode and activates the high-clock-frequency test mode in response to a high frequency test command in the test mode. In another specific embodiment, the method activates the high-clock-frequency test mode directly from the user mode in response to a high frequency test command. In an embodiment in which the memory device is a serial flash memory device, the testing of the memory device includes programming data patterns into the memory cells, reading memory cells to verify the data patterns, erasing memory cells in the memory devices, and issuing commands to the memory device to verify user mode and test mode operations. In other embodiments for other memory device, appropriate testing steps can be selected.

The present invention includes various ways for generating a clock signal in a memory device. In a specific embodiment, the generating of the second clock signal further includes receiving a third clock signal from the memory tester, which is characterized by the first clock frequency and also characterized by a ¼ cycle phase shift with respect to the first clock signal. The method includes generating the second clock signal by coupling the first and third clock signals to an EXCLUSIVE-OR circuit, which outputs the second clock signal that is characterized by a clock frequency twice the first clock frequency. In another embodiment, the second clock signal is generated in a circuit that couples the first clock signal to a PLL (phase locked loop) circuit which produces the second clock signal having a clock frequency which is twice the clock frequency of the first clock signal. In another embodiment, the method generates the second clock signal by providing a fourth clock signal in response to a rising edge of the first clock signal and a fifth clock signal in response to a falling edge of the first clock signal. The method combines the fourth and fifth clock signals, for example, by using an OR circuit, to generate the second clock signal. The second clock signal is characterized by a clock frequency that is twice the first clock frequency. In a particular embodiment, the first clock frequency is 40 MHz, and the second clock frequency is 80 MHz.

In another embodiment of the present invention, a method is provided for operating a memory device. In a particular embodiment, a method is provided for operating a serial flash memory device. In other embodiments, the memory device can include other kinds of memory devices, such as DRAM, SRAM, parallel flash memory, and other non-volatile devices, etc. The method includes receiving a first clock signal characterized by a first clock frequency and applying the first clock signal to the memory device. The method includes generating a second clock signal in the memory device in response to the first clock signal. The second clock signal is characterized by a second clock frequency higher than the first clock frequency. For example, in a particular embodiment, the first clock frequency is 40 MHz and the second clock frequency is 80 MHz. After the second clock is generated the method includes operating the memory device at the second clock frequency. In a specific embodiment in which the memory device includes a serial flash memory device, the operating of the memory device includes programming data patterns into the memory cells, reading memory cells to verify the data patterns, erasing memory cells in the memory devices, and issuing commands to the memory device to verify user mode and test mode operations.

In a specific embodiment of the method, the generating of the second clock signal includes receiving a third clock signal which is characterized by the first clock frequency, and is also characterized by a ¼ cycle phase shift with respect to the first clock signal. In this particular embodiment, the method generates the second clock signal by coupling the first and third clock signals to an EXCLUSIVE-OR circuit, which outputs the second clock signal characterized by a clock frequency that is twice the first clock frequency. Of course, there can be other variations, modifications, and alternatives.

According to an alternative embodiment, the invention provides a memory device capable of operating with multiple internal clock frequencies. The memory device includes a memory array having a plurality of memory cells. The memory device includes a first input terminal for receiving a first clock signal, which is characterized by a first frequency and a first clock phase. The memory device includes a clock generating circuit for receiving the first clock signal and generating a second clock signal, which is characterized by a second clock frequency and a second clock phase. In an embodiment, the memory device also includes a multiplexer circuit for selecting a master clock signal from the first and the second clock signals in response to a clock-selection control signal. The memory device also includes other functional circuit blocks for memory operations. For example, in a specific embodiment, the memory device includes a command register for receiving the master clock signal and issuing the clock-selection control signal. In an embodiment, the memory device includes an address register for receiving the master clock signal and providing a memory address to the memory array. In an embodiment, the memory device includes an output register for receiving an output data from the memory array in response to the master clock signal.

In a specific embodiment, the memory device includes a serial flash memory device. In an embodiment, the memory device includes a second input pin for receiving a third clock signal characterized by the first frequency and further characterized by a ¼ cycle phase shift with respect to the first clock signal. The clock generating circuit is further configured for receiving the first and third clock signals and generating the second clock signal. In a specific embodiment the clock generating circuit includes an EXCLUSIVE OR circuit. In an embodiment, the clock generating circuit includes a PLL circuit for receiving the first clock signal and producing a second clock signal, which characterized by a clock frequency which is twice the clock frequency of the first clock signal. In another embodiment, the clock generating circuit includes a clock edge detection circuit for receiving the first clock signal, first one-shot circuit for producing a fourth clock signal at the rising edge of the first clock signal, second one-shot circuit for producing a fifth clock signal at the falling edge of the first clock signal, and an OR circuit for combining the fourth and fifth clock signals to produce the second clock signal, which is characterized by a clock frequency twice the clock frequency of the first clock signal. Depending upon the embodiments, the invention can include a wide range of clock frequencies. For example, in a specific embodiment, the first clock frequency is 40 MHz and the second clock frequency is 80 MHz. In an embodiment, the memory device also includes a state machine which includes a user mode state, a test mode state, and a high-clock-frequency state. The state machine is configured to enter the test mode state in response to an input command signal. The state machine enters the high frequency test state from either the user mode state or the test mode state in response to a high-clock frequency command. The memory device also includes a command decoder configured to issue the clock-selection control signal when the state machine is in the high-clock-frequency state.

In another embodiment of the invention, a method is provided for making a memory device capable of operating with multiple internal clock frequencies. The method includes providing a memory array having a plurality of memory cells. The method includes providing a first input terminal for receiving a first clock signal of a first frequency and a first clock phase. The method adds a clock generating circuit for receiving the first clock signal and generating a second clock signal, which is characterized by a second clock frequency and a second clock phase. The method adds a multiplexer circuit for selecting a master clock signal from the first and the second clock signals in response to a clock-selection control signal. The method includes providing a command register for receiving the master clock signal and issuing the clock-selection control signal. In an embodiment, the method includes providing an address register for receiving the master clock signal and providing a memory address to the memory array. The method also includes providing an output register for receiving an output data from the memory array in response to the master clock signal.

In a specific embodiment, the memory device includes a serial flash memory device. In an embodiment, the method includes adding a second input pin for receiving a third clock signal characterized by the first frequency and further characterized by a ¼ cycle phase shift with respect to the first clock signal. The method also includes configuring the clock generating circuit for receiving the first and third clock signals and generating the second clock signal. For example, the clock generating circuit may include an EXCLUSIVE OR circuit. In a specific embodiment, the clock generating circuit includes a PLL circuit for receiving the first clock signal and producing a second clock signal, which is characterized by a clock frequency which is twice the clock frequency of the first clock signal. In a specific embodiment, the method also includes providing a clock edge detection circuit for receiving the first clock signal, providing a fourth clock signal at the rising edge of the first clock signal, providing a fifth clock signal at the falling edge of the first clock signal. The method also includes adding a combining circuit for combining the fourth and fifth clock signals to produce the second clock signal characterized by a clock frequency which is twice the clock frequency of the first clock signal. The method can include a wide range of clock frequencies. For example, in a specific embodiment, the first clock frequency is 40 MHz and the second clock frequency is 80 MHz. In a specific embodiment, the method also includes providing a state machine which includes a user mode state, a test mode state, and a high-clock-frequency state. In a specific embodiment, the state machine is configured to enter the test mode state in response to an input command signal. In an embodiment, the state machine enters the high frequency test state from either the test mode state or the user mode state in response to a high-clock frequency command. In an embodiment, the memory device also includes a command decoder configured to issue the clock-selection control signal when the state machine is in the high-clock-frequency state. Of course, there are many variation, modifications, and alternatives.

Many benefits are achieved by way of the present invention over conventional techniques. For example, according to an embodiment of the invention, a technique is provided for a memory device which can be operated at multiple internal clock frequencies. In another embodiment, the invention provides a method of high frequency testing a memory device using a low frequency tester, thus reducing the cost of testing the memory devices. In a specific embodiment, a method and apparatus are provided which enable high speed wafer level testing to reduce the cost involved in expensive final tests of packaged parts. Additionally, the invention provides a method and device that is compatible with conventional design and process technology without substantial modifications to conventional equipment and processes. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques directed to integrated circuit memory testing and design are provided. More particularly, the invention provides a method and apparatus for memory device testing at a higher clock rate than the clock rate provided by a memory tester. Merely by way of example, the invention has been applied to serial flash memory devices for the manufacture of integrated circuits. But it would be recognized that the invention has a much broader range of applicability. For example, the invention can be applied to other memory devices such DRAM, SRAM, parallel flash, or other non-volatile memories The invention can also be applied to systems that include synchronized circuits.

Depending upon the embodiment, the present invention includes various features, which may be used. These features include the following:

1. Provide a method for testing a memory device at a high frequency using a low frequency tester;
2. Provide a design of a memory device which can be operated on multiple internal clock frequencies; and
3. Provide a method for providing high speed wafer level testing to reduce the cost involved in expensive final tests of packaged IC parts.

As shown, the above features may be in one or more of the embodiments to follow. These features are merely examples, which should not unduly limit the scope of the claims herein. One of ordinary skill in the art would recognize many variations, modifications, and alternatives.

Figure 1:
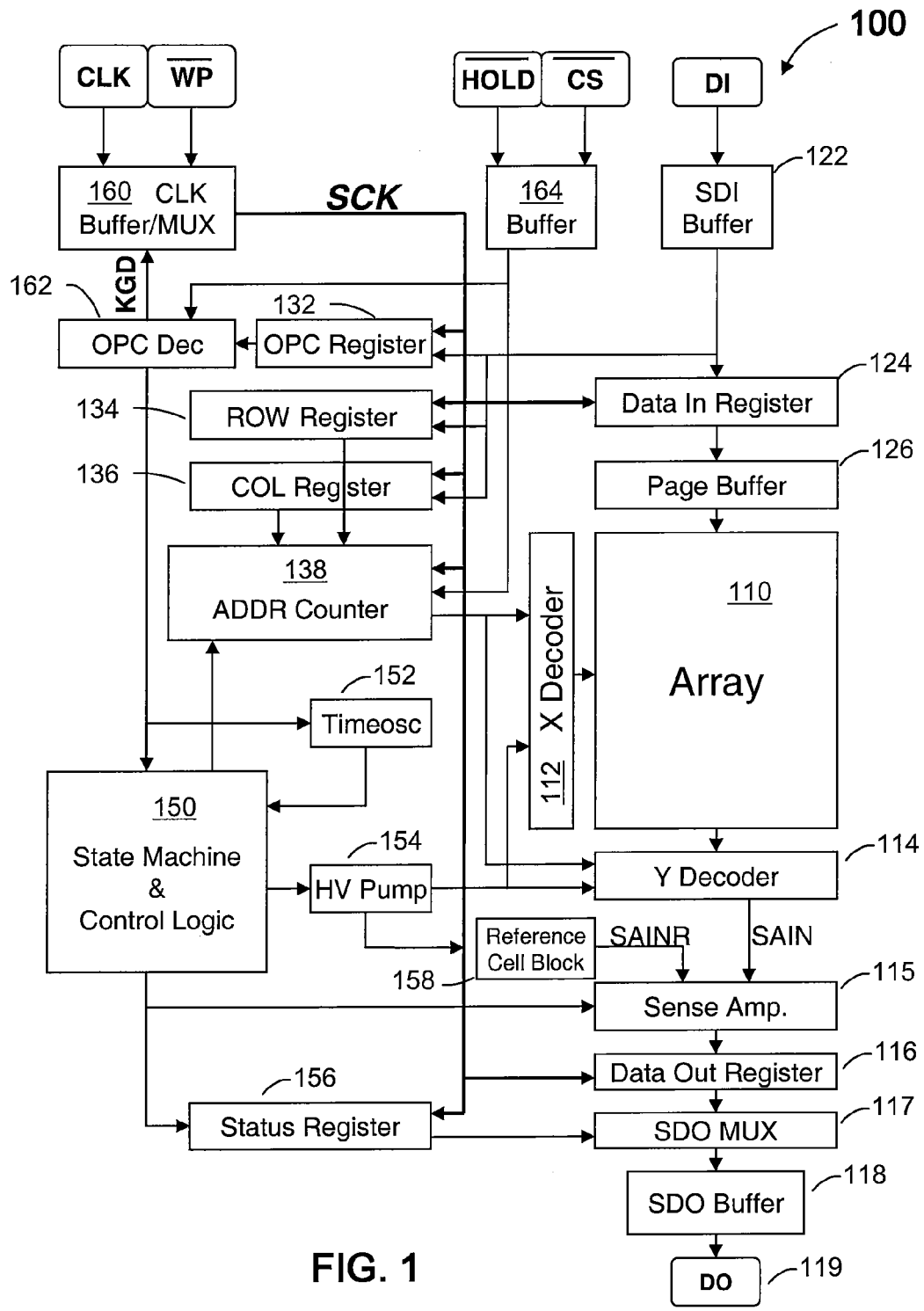
FIG. 1 is a simplified block diagram of a flash memory device according to an embodiment of the present invention.

FIG. 1 is a simplified block diagram of a serial flash memory device 100 according to an embodiment of the present invention. This diagram is merely an example, which should not unduly limit the scope of the claims herein. One of ordinary skill in the art would recognize other variations, modifications, and alternatives. As shown, serial flash memory device 100 include input terminals CLK (clock), HOLD (hold), WP (write protect), CS (chip select), and DI (data in), and an output terminal DO (data out) according to an embodiment of the invention. In a specific embodiment, flash memory device 100 also includes an array 110 of flash memory cells, which are accessed with addresses provided by X Decoder 112 and Y Decoder 114. The data in a memory cell is read by the sense amplifier 115, which determines the data value of a memory cell according to a data signal SAIN from a memory cell in array 110 and a reference signal SAINR from a reference cell in the Reference Cell Block 158. In a specific embodiment, the Reference Cell Block is a memory block separate from memory array 110 where data is stored. The data value is provided to output terminal DO 119 through Data Out Register 116, output multiplexer SDO MUX 117, and output buffer SDO Buffer 118. Of course, there could be other variations, modifications, and alternatives.

Referring to FIG. 1, data input signals are provided to serial flash memory array 100 through the DI (Date In) terminal. The data input signals pass through SDI Buffer 122, Data In Register 124, and into Page Buffer 126 before the data is programmed into memory array 110. The data input signals also enter OPC Register 132, where the operation codes are extracted to direct the operation of the memory device. Address inputs are entered into Row Register 134, Column Register 136, and Address Counter 138, where the address inputs are separated and fed into X Decoder 112 and Y Decoder 114 for addressing the memory array 110.

In a specific embodiment, memory device 100 also includes clock and control circuitries. Referring back to FIG. 1, the HOLD and CS (chip select) signals enter Buffer 164 and then are fed to operation code decoder 162 and address counter 138. The operation of memory device 100 is controlled by the state machine and control logic in block 150, which communicates with high voltage charge pump in block 154, status register 156, oscillator Timeosc 152, and the sense amplifier 115, among others. In a specific embodiment of the invention, clock control is provided by the clock buffer and multiplexer block 160, which supplies a master system clock signal SCK to various operational circuit blocks, such as operation code register 132, Row register 134, Column register 136, Address Counter 138, Status Register 156, Data In Register 124 and Data Out Register 116, etc. The memory device is operated at a speed in response to a clock frequency of the master system clock SCK. The operation of clock control in memory device 100 is discussed in more detail below. Of course, there could be other variations, modifications, and alternatives.

Figure 2:
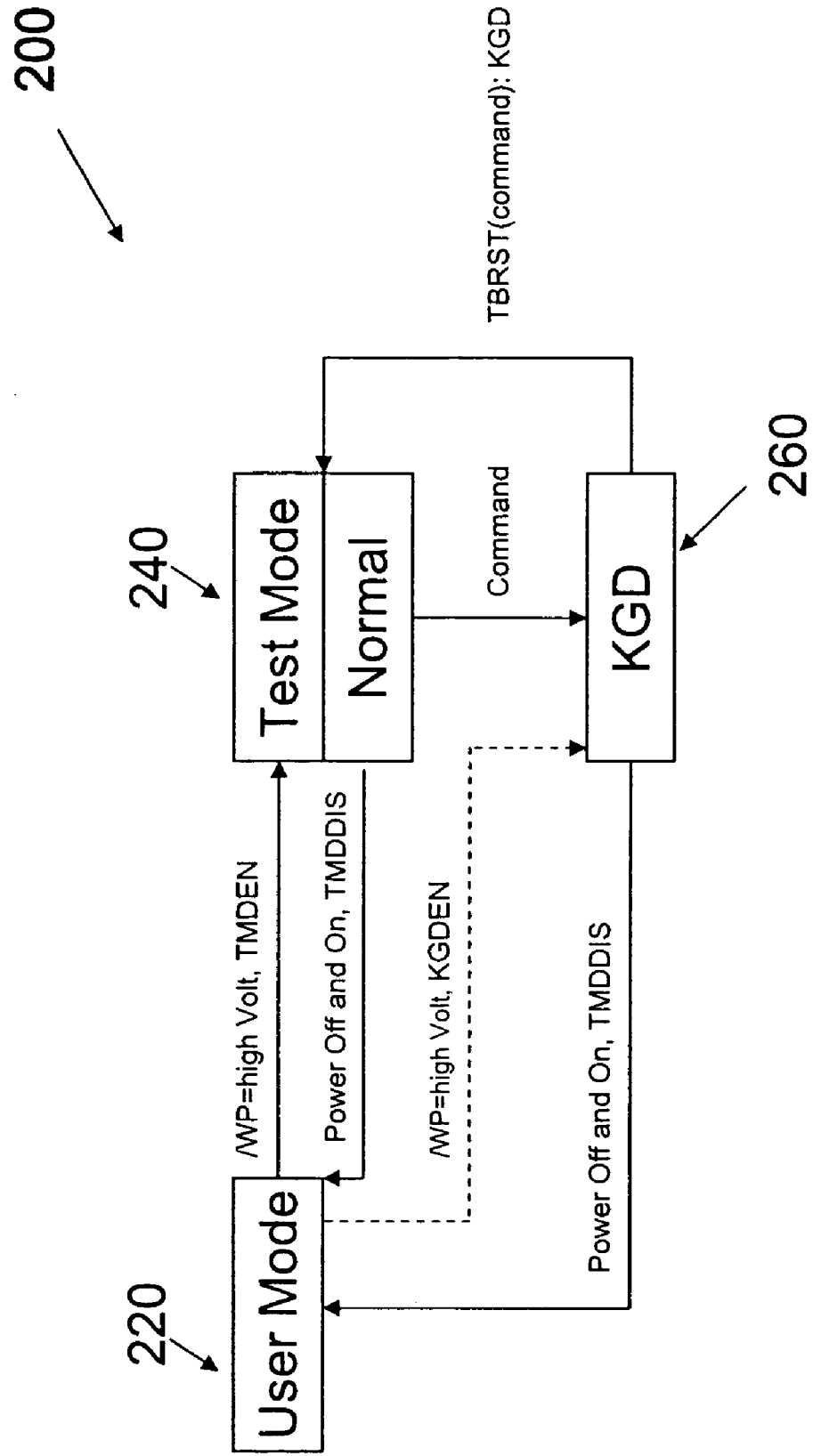
FIG. 2 is a simplified block diagram of control flow in a flash memory device according to an embodiment of the present invention.

FIG. 2 is a simplified block diagram 200 of control flow in a flash memory device according to an embodiment of the present invention. This diagram is merely an example, which should not unduly limit the scope of the claims herein. One of ordinary skill in the art would recognize other variations, modifications, and alternatives. As shown, the memory device provides a user mode 220 and a test mode 240 according to a specific embodiment of the invention. In the user mode, the memory device can carry out memory operations such as read, program, and erase to the cells in the memory array. In the test mode, various additional functions are provided for testing and debugging the memory device. In a specific embodiment in which the memory device includes a serial flash memory device, the operation of the memory device includes programming data patterns into the memory cells, reading memory cells to verify the data patterns, erasing memory cells in the memory devices, and issuing commands to the memory device to verify user mode and test mode operations, etc. As is known, memory test equipment is expensive and testing of flash memory devices is time consuming and costly. In certain applications, a tester is often configured to test multiple unpackaged flash memory devices simultaneously to determine known-good-die (KGD). Often the tester is not capable to provide high frequency clock signals to the memory devices under test. Under this condition, the memory devices often are not thoroughly tested at operating clock frequencies. Therefore it is desirable to be able to exercise a memory device at a clock frequency which is higher than the clock frequency provided by a tester.

In a specific embodiment, memory device 100 provides a special high-clock-frequency test mode (KGD mode) 260 in which the memory device can be operated at a clock frequency that is twice the clock frequency provided by a tester. As shown in FIG. 2, test mode 240 is entered when the WP (write protect) signal is set to a high voltage and a test mode enable command is issued. Then TMDEN (test mode enable) signal is turned on. In a specific embodiment, the memory device operates at 3.3 volts, and a high voltage of 10 volts, for example, is used to activate the Test mode. In Test Mode/Normal 240, a test mode KGD command "Command" enables the KDG mode 260 the high-clock-frequency test mode. In an alternative embodiment, test mode 240 is entered when the WP (write protect) signal is set to a high voltage and a KGD mode enable command is issued. Then KGDEN (KGD mode enable) signal is turned on. In this embodiment, memory device 100 enters the KGD mode directly from the user mode. The KGD mode 260 can issue a "TBRST(command):KGD" to enter Test Mode/Normal 260. Also shown in FIG. 2, the memory device can be returned to the User Mode when the TMDDIS (test mode disable) signal is set, or when the memory device is powered off and then powered on. Of course, there could be other variations, modifications, and alternatives.

Figure 3:
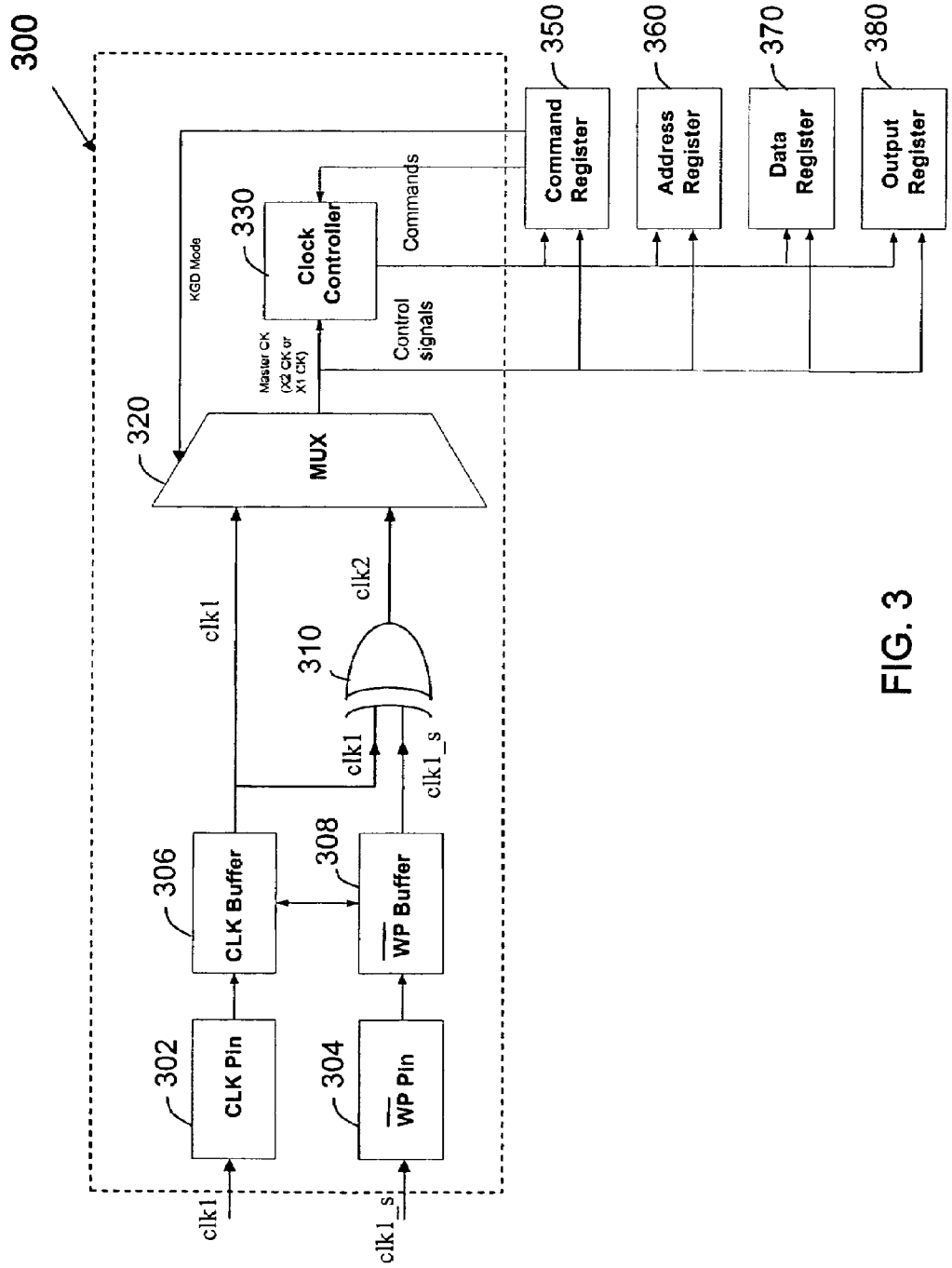
FIG. 3 is a simplified block diagram of a clock control circuit in a flash memory device according to an embodiment of the present invention.
Figure 4:
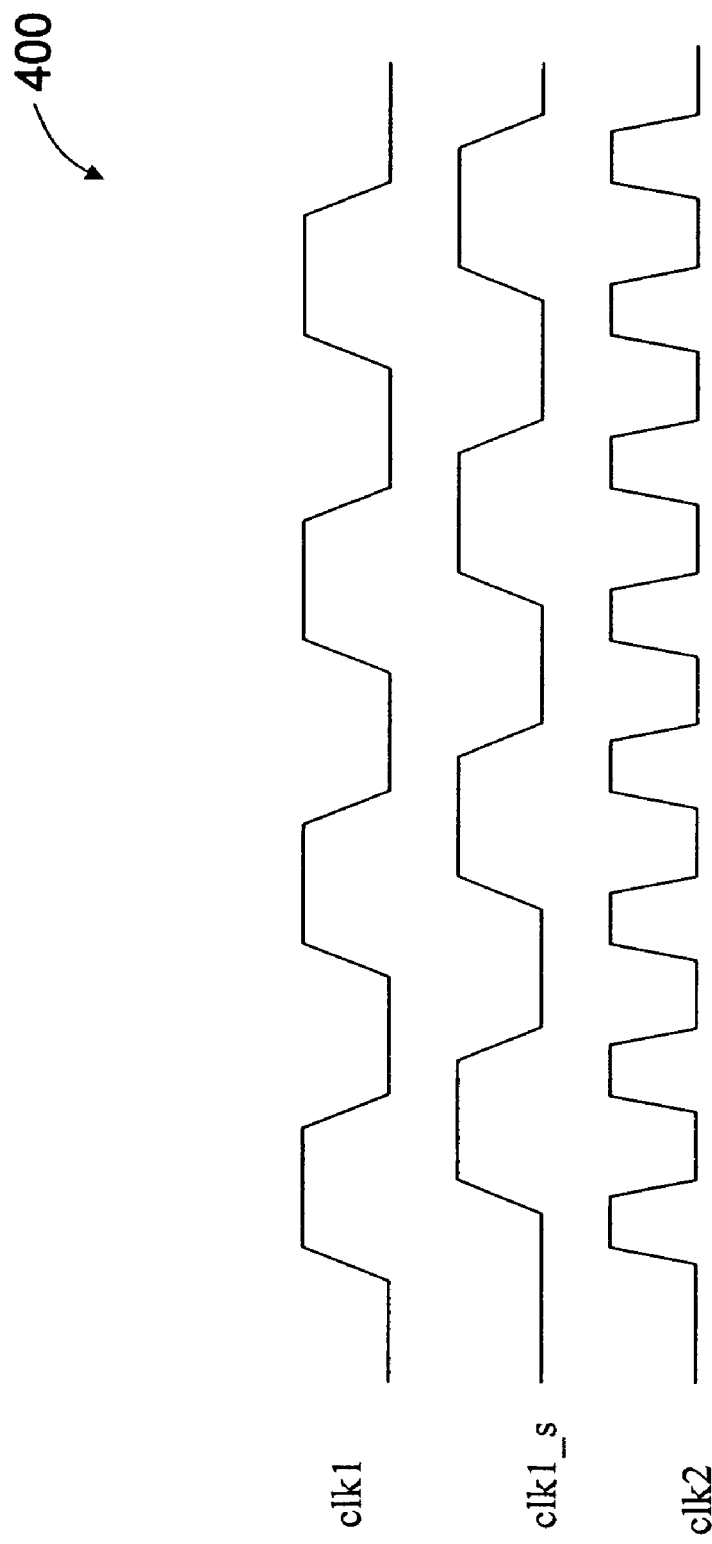
FIG. 4 is a simplified timing diagram for a clock generation method according to an embodiment of the present invention.

FIG. 3 is a simplified block diagram of a clock control circuit 300 for a flash memory device according to an embodiment of the present invention. This diagram is merely an example, which should not unduly limit the scope of the claims herein. One of ordinary skill in the art would recognize other variations, modifications, and alternatives. As shown, clock control circuit 300 includes a first clock input terminal CLK Pin 302 and a second clock input terminal 304 which may be, for example, a WP (write protect) pin in an embodiment of a serial flash memory. In another embodiment, the second clock terminal input can be a HOLD pin. In a specific embodiment, a first clock signal clk1 at, for example, 40 MHz is coupled to input terminal 302. Depending upon the embodiments, other clock frequencies can be used. In some embodiments, for example, the first clock signal can range from 30 to 100 MHz. In other embodiments, the first clock frequency can be much higher. The first clock signal is fed through clock buffer 306 to multiplexer block 320 and to an input terminal of an EXCLUSIVE OR gate 310. In an embodiment, a second clock signal clk1_s also at 40 MHz, but includes a clock phase shift of a quarter cycle, is coupled to input terminal 304. Clock signal clk1_s is then connected through buffer 308 to a second input terminal of exclusive or gate 310. As illustrated in FIG. 4, the output of EXCLUSIVE OR gate 310 is a clock signal clk2 having a clock frequency of 80 MHz.

Referring back to FIG. 3, multiplexer circuit block 320 receives two clock signals clk1 and clk2. In a specific embodiment, one of the clock signals is characterized by a clock frequency of 40 MHz and the other clock signal is characterized by a clock frequency of 80 MHz. In response to an input signal KGD Mode (high-clock-frequency test mode), multiplexer circuit block 320 selects a master system clock signal MasterCK labeled as "Master CK (x2CK or x1CK)" from the two input clock signals clk1 and clk2. As illustrated in FIG. 3, in a specific embodiment, master system clock signal Master CK is coupled to Clock Controller 330, Command Register 350, Address Register 360, Data Register 370, and Output Register 380. Clock Controller 330 issues Control signals to Command Register 350, Address Register 360, Data Register 370, and Output Register 380. Command Register 350 issues Commands to Clock Controller 330. In the specific embodiment as shown in FIG. 1, the address register is referred to as ROW Register 134 and COL Register 136, the data register is referred to as the Data In Register 124, and the output register is referred to as Data Out Register 116. In an embodiment, a flash memory device can be operated with a clock frequency of 40 MHz or 80 MHz, depending on whether the KGD Mode signal is set. As discussed above with reference to FIGS. 1 and 2, the KGD Mode signal is selected in a Test mode. Command Register 350 is provided for command decoding and selection. An example of a command register is the OPC register 132 in FIG. 1. According to an embodiment of the invention, an high-clock-frequency test mode of operation (KGD mode) is provided in which a clock signal having twice the clock frequency of the input clock signal is coupled to circuit blocks needed to carry out all the User mode operations as well as Test mode operations of the memory device. For example, these circuit blocks include a command register 350 for receiving the master clock signal and issuing the clock-selection control signal, an address register 360 for receiving the master clock signal and providing a memory address to the memory array, a data register 370 for receiving an input data in response to the master clock signal, and an output register 380 for receiving an output data from the memory array in response to the master clock signal, etc. The memory device can then be exercised at a higher clock frequency than can be provided by an external clock circuit in a memory tester. Of course, there could be other variations, modifications, and alternatives.

In a specific embodiment, doubling a clock frequency can be achieved by combining two input clock signals from the tester. FIG. 4 is a simplified timing diagram for a clock generating method in a flash memory device according to an embodiment of the present invention. This diagram is merely an example, which should not unduly limit the scope of the claims herein. One of ordinary skill in the art would recognize other variations, modifications, and alternatives. As shown, the first clock signal clk1 is characterized by a first clock frequency, which for example, can be 40 MHz in a particular embodiment of the invention. Another clock signal clk1_s is characterized by the same frequency as clk1 which is 40 MHz in this embodiment. Clock signal clk1_s is shifted by ¼ cycle in phase with respect to clock signal clk1. In a specific embodiment, clock signals clk1 and clk1_s are fed into an EXCLUSIVE_OR (XOR) circuit (310 in FIG. 3) to generate a clock signal clk2. As shown in FIG. 4, clk2 has twice the frequency as clk1. In a particular embodiment in which clk1 is 40 MHz, clk2 is 80 MHz. Both clk1 and clk2 are available as inputs to multiplexer circuit (320 in FIG. 3) which is configured to select one of them to be a system master clock for testing and operating the memory device, as described in FIGS. 1 and 3. Of course, there can be other variations, modifications, and alternatives.

Figure 5:
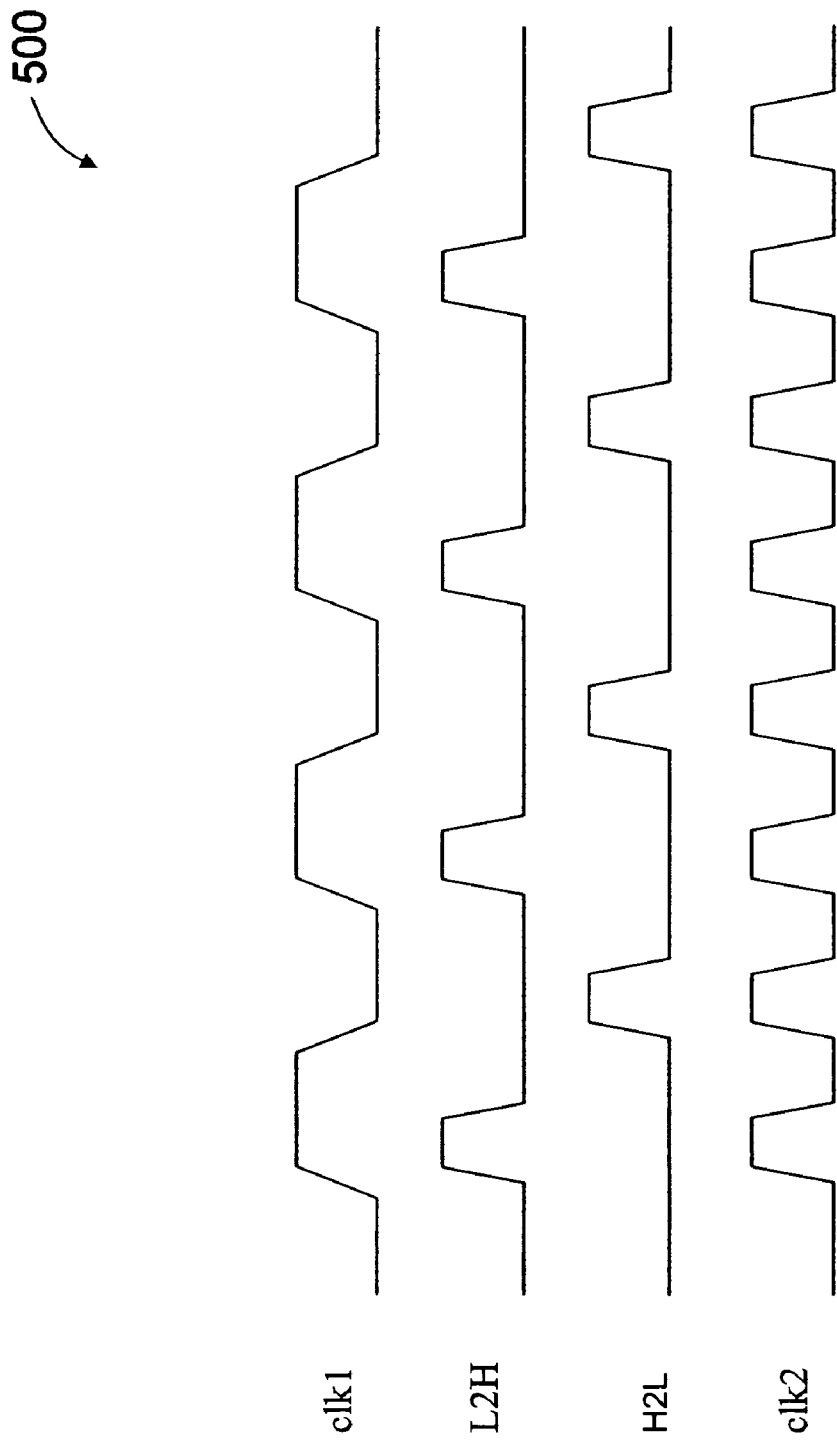
FIG. 5 is a simplified timing diagram of a clock generation method according to another embodiment of the present invention.

FIG. 5 is a simplified timing diagram for a clock generating method in a flash memory device according to another embodiment of the present invention. This diagram is merely an example, which should not unduly limit the scope of the claims herein. One of ordinary skill in the art would recognize other variations, modifications, and alternatives. As shown, clk1 is a clock signal received from an input pin of the memory device. In a specific embodiment, clk1 is a clock signal of a clock frequency of 40 MHz. In an embodiment, a clock signal, labeled L2H in FIG. 5, is generated in response to a rising edge of clock signal clk1. L2H may be generated by a conventional digital one-shot circuit. For example, a one-shot circuit may include a delayed element and an OR circuit. Similarly, clock signal H2L is generated in response to a falling edge of clock signal clk1. In an embodiment, clock signals L2H and H2L are coupled to input terminals of another OR circuit, which outputs a clock signal clk2 characterized by a clock frequency twice that of clock signal clk1. Both clk1 and clk2 are available as inputs to multiplexer circuit (320 in FIG. 3) which is configured to select one of them to be a system master clock for testing and operating the memory device, as described in FIGS. 1 and 3. Of course, there can be other variations, modifications, and alternatives.

Figure 6:
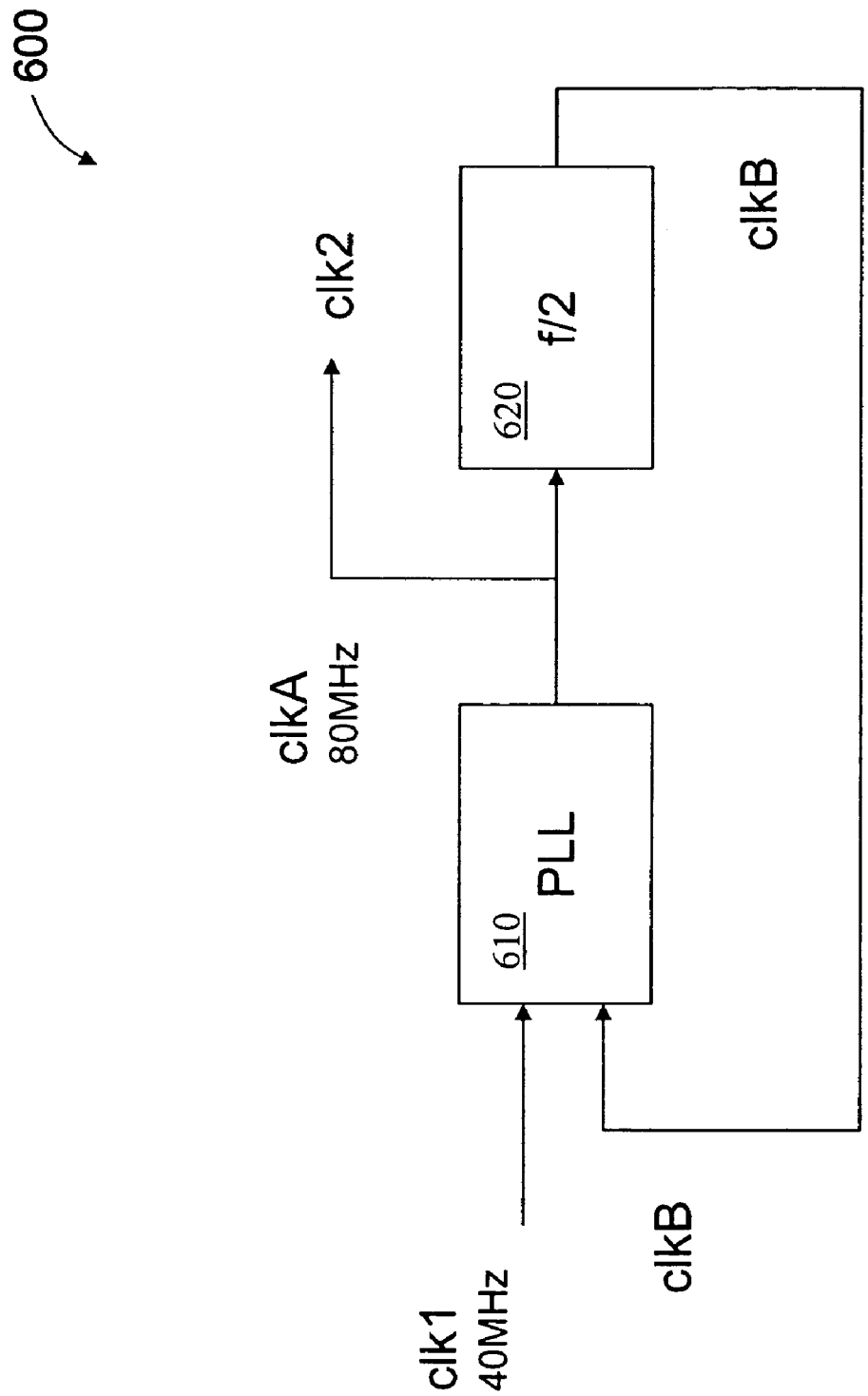
FIG. 6 is a simplified block diagram of a clock generation circuit according to an alternative embodiment of the present invention.

FIG. 6 is a simplified block diagram 600 of a clock generation circuit for a flash memory device according to an alternative embodiment of the present invention. This diagram is merely an example, which should not unduly limit the scope of the claims herein. One of ordinary skill in the art would recognize other variations, modifications, and alternatives. As shown, an input clock signal clk1 is coupled to a phase-locked loop (PLL) circuit 610. An output signal of 610 is coupled to a frequency divider 620. Output signal clkB from the frequency divider 620 (f/2) fed back to the PLL circuit 610. PLL circuit 610 adjusts clock signal clkB to match the frequency of the input clock signal. Therefore, the frequency of PLL output clk2, also labeled clock signal clkA, is equal to twice of the frequency of input clock signal clk1. Since it takes time for the PLL to lock on the frequency of the input clock, certain wait time (in micro seconds) is required before the higher frequency clock signal is ready for use. In a specific embodiment, this is achieved by discarding a fixed number of dummy clock cycles in the early stage of the high-clock-frequency mode (KGD mode). In a specific embodiment, the high-clock-frequency mode (KGD mode) is used as a test mode, and this delay may not degrade product performance. Of course, there can be other variations, modifications, and alternatives.

According to a specific embodiment of the present invention, a method for performing high frequency test of a memory device is provided. The method can be briefly outlined below.

1. Provide a memory tester capable of generating a first clock signal characterized by a first clock frequency;
2. Apply the first clock signal to the memory device;
3. Receive a command for activating a high-clock-frequency test mode;
4. Generate a second clock signal in the memory device in response to the first clock signal; and
5. Test the memory device at the second clock frequency.

The above sequence of steps provides method for testing a memory device at a high frequency according to an embodiment of the present invention. As shown, the method uses a combination of steps including a way of generating a high frequency internal clock in the memory device from an input clock signal of a tester. Other alternatives can also be provided where steps are added, one or more steps are removed, or one or more steps are provided in a different sequence without departing from the scope of the claims herein. Further details of the present method can be found throughout the present specification and more particularly below.

Figure 7:
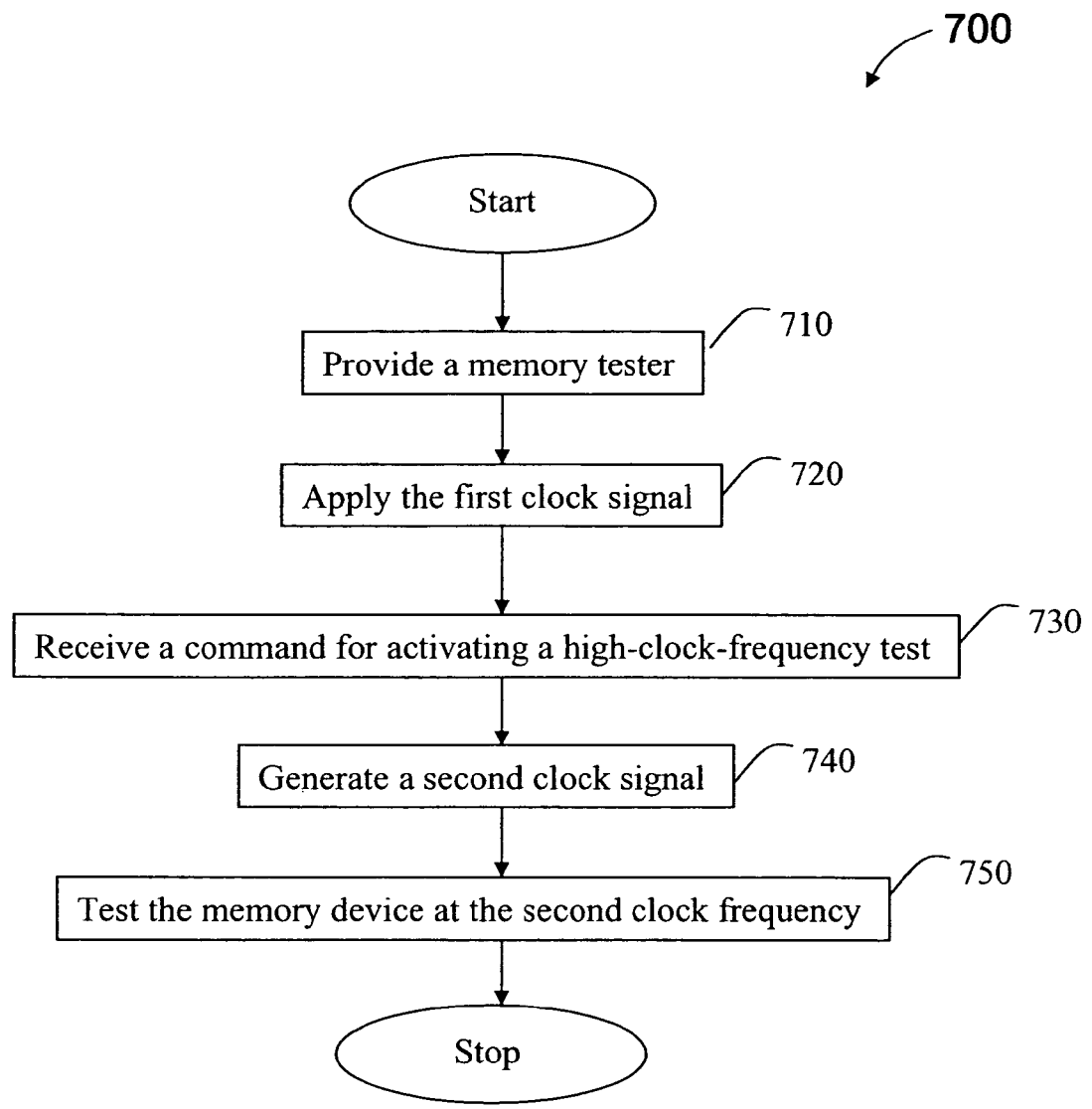
FIG. 7 is a simplified flow diagram of a method for testing a memory device according to an embodiment of the present invention.

FIG. 7 is a simplified flow diagram of a method for testing a memory device according to an embodiment of the present invention. This diagram is merely an example, which should not unduly limit the scope of the claims herein. One of ordinary skill in the art would recognize other variations, modifications, and alternatives. As shown, the method is for high frequency testing of a memory device according to a specific embodiment of the invention. In a particular embodiment, the memory device includes a serial flash memory device. In some embodiments, packaged memory devices are tested. In certain embodiments, the method can be applied to wafer-level testing of serial flash memory devices. For such testing, a semiconductor wafer including a number of serial flash memory devices is placed in a memory tester. The memory device includes bonding pads for accessing the internal circuit in the memory devices. The memory tester may use a load board to contact the bonding pads and to access a selected group of memory devices on the wafer for testing. In other embodiments, the method can also be applied to testing of other memory devices and systems that include other synchronized circuits. In an embodiment, the method includes providing a memory tester (step 710) capable of generating a first clock signal characterized by a first clock frequency. In some embodiments, the method includes providing a memory tester operable in a clock frequency range, for example, from 30 to 100 MHz. In a specific embodiment, the first clock frequency is 40 MHz. Of course, there can be other variations, modifications, and alternatives.

In an embodiment, the method includes applying the first clock signal (step 720) to the memory device. For testing packaged memory devices, the clock signal is applied to a pin of a packaged memory device. For wafer level testing, the method includes subjecting the second plurality of serial flash memory devices to the first clock signal from the memory tester. In this case, the clock signal is applied to a bonding pad of a memory device. Depending upon the application, the memory devices can be tested at a clock frequency provides by the tester. In other applications, it may be desirable to test the memory device at a higher clock frequency than provided by the tester. For example, a memory device could be designed to operate at a clock frequency higher than the tester clock frequency. A low-frequency tester is often less expensive than a high-frequency tester. Therefore, it can be advantageous to test a memory device using a low-frequency tester. In addition, an internally generated high-frequency clock signal can enable certain test functions usually carried out at final test on a more expensive tester. In an embodiment of the invention, certain high frequency final test functions are carried out at wafer-level testing. The memory device (step 730) receives a command for activating a high-clock-frequency test mode. In a specific embodiment, the receiving of the command includes the following steps:

1. Receiving a high voltage signal at an input pin. The high voltage signal is substantially higher than an operating voltage of the memory device;
2. Setting the memory device in a test mode; and
3. Activating the high-clock-frequency test mode in response to a high frequency test command in the test mode.

In an alternative specific embodiment, the method includes entering the high-clock-frequency test mode directly from the user mode. In such embodiment, the receiving of the command includes the following steps:

1. Receiving a high voltage signal at an input pin. The high voltage signal is substantially higher than an operating voltage of the memory device; and
2. Activating the high-clock-frequency test mode in response to a high frequency test command in the test mode.

Of course, there can be other variations, modifications, and alternatives.

In a specific embodiment, the method generates a second clock signal in the memory device in response to the first clock signal (step 740). The second clock signal is characterized by a second clock frequency which is higher than the first clock frequency. For example, in an embodiment, the first clock frequency is 40 MHz, and the second clock frequency is 80 MHz. The present invention includes various methods for generating the second clock signal. For example, in a particular embodiment as discussed above with reference to FIG. 4, the generating of the second clock signal includes receiving a third clock signal from the memory tester. The third clock signal is characterized by the first clock frequency. In a specific embodiment, the third clock can be 40 MHz. The third clock signal is also characterized by a ¼ cycle phase shift with respect to the first clock signal. In an embodiment, the method generates the second clock signal by coupling the first and third clock signals to an EXCLUSIVE-OR circuit, whereby the second clock signal is generated and characterized by a clock frequency that is twice the first clock frequency. In another embodiment as discussed above with reference to FIG. 5, the generating of the second clock signal includes providing a fourth clock signal in response to a rising edge of the first clock signal and providing a fifth clock signal in response to a falling edge of the first clock signal. The method then combines the fourth and fifth clock signals to generate the second clock signal which is characterized by a clock frequency that is twice the first clock frequency. In yet another embodiment, the generating of the second clock signal includes coupling the first clock signal to a PLL, as discussed above with reference to FIG. 6. Of course, there can be other variations, modifications, and alternatives.

In a specific embodiment, the method tests the memory device at the second clock frequency (step 750). In an embodiment, in which the memory device is serial flash memory, the testing includes, but is not limited to, the following steps.

1. Programming various data patterns into the memory cells;
2. Reading memory cells to verify the data patterns;
3. Erasing memory cells in the memory devices; and
4. Issuing commands to the memory device to verify user mode and test mode operations, etc.

Of course, there can be other variations, modifications, and alternatives.

The above sequence of steps provides an efficient method for testing a memory device at a high-clock-frequency according to an embodiment of the present invention. As shown, the method uses a combination of steps including a way of generating a high frequency internal clock in the memory device from one or more input clock signals of a tester. Other alternatives can also be provided where steps are added, one or more steps are removed, or one or more steps are provided in a different sequence without departing from the scope of the claims herein. Additionally, although the above has been described in terms of a serial flash memory device, other devices can also be used. Further details of these other devices using the present method can be found throughout the present specification and more particularly below.

According to a specific embodiment of the present invention, a method is provided for making a memory device capable of operating with multiple internal clock frequencies. The method can be briefly outlined below.

1. Provide a memory array including a plurality of memory cells;
2. Provide a first input terminal for receiving a first clock signal;
3. Add a clock generating circuit for generating a second clock signal;
4. Add a multiplexer circuit for selecting a master clock signal;
5. Provide a command register for receiving the master clock signal and issuing the clock-selection control signal;
6. Provide an address register for receiving the master clock signal and providing a memory address to the memory array; and
7. Provide an output register for receiving an output data from the memory array in response to the master clock signal.

The above sequence of steps provides a method for making a memory device capable of being operated at a high-clock-frequency. As shown, the method uses a combination of steps including a way of generating a high frequency internal clock in the memory device from an input clock signal. Other alternatives can also be provided where steps are added, one or more steps are removed, or one or more steps are provided in a different sequence without departing from the scope of the claims herein. Further details of the present method can be found throughout the present specification and more particularly below.

Figure 8:
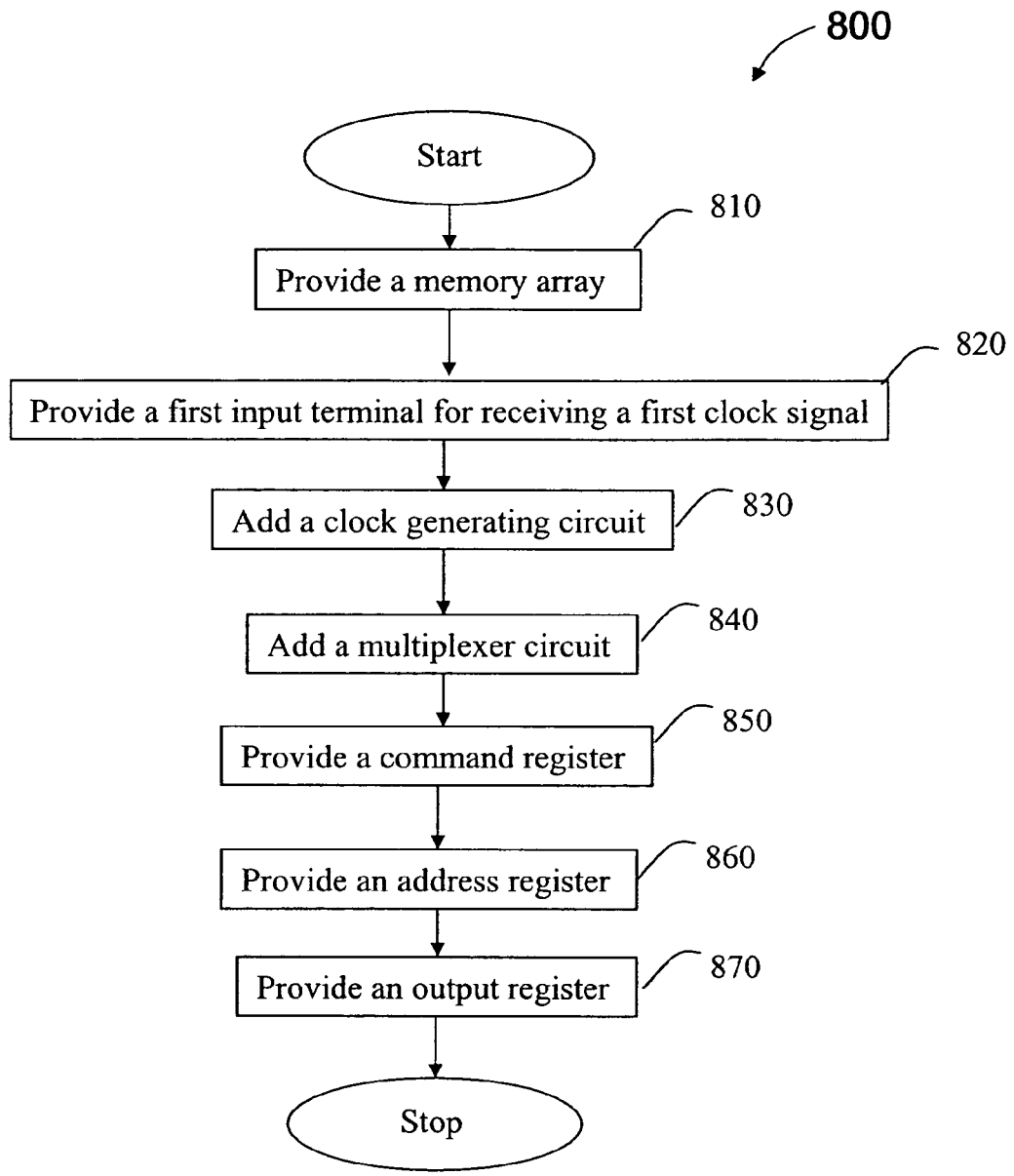
FIG. 8 is a simplified flow diagram of a method for making a memory device according to an embodiment of the present invention.

FIG. 8 is a simplified flow diagram 800 of a method for making a memory device capable of being operated at a high-clock-frequency according to an embodiment of the present invention. This diagram is merely an example, which should not unduly limit the scope of the claims herein. One of ordinary skill in the art would recognize other variations, modifications, and alternatives. As shown, the method is for making a memory device capable of operating with multiple internal clock frequencies. The method includes providing a memory array comprising a plurality of memory cells (step 810). In a specific embodiment, the memory device can be a serial flash memory device. In other embodiments, the memory device can be another kind of memory device such DRAM, SRAM, parallel flash, or other non-volatile memories. In some embodiments, the invention can also be applied to systems that include other synchronized circuits. Of course, there can be other variations, modifications, and alternatives.

In step 820, the method provides a first input terminal for receiving a first clock signal, which is characterized by a first frequency and a first clock phase. For example, in a particular embodiment, the first clock frequency can be 40 MHz. In other embodiment, the clock frequency can be chosen according to the particular applications. Of course, there can be other variations, modifications, and alternatives.

In a specific embodiment, the method (in step 830) adds a clock generating circuit for receiving the first clock signal and generating a second clock signal, which is characterized by a second clock frequency and a second clock phase. In an embodiment, the method adds a second input pin for receiving a third clock signal characterized by the first frequency and further characterized by a ¼ cycle phase shift with respect to the first clock signal. The method also configures a clock generating circuit for receiving the first and third clock signals and generating the second clock signal. In a particular embodiment, the clock generating circuit includes an EXCLUSIVE OR circuit. In an embodiment, the first clock frequency is 40 MHz and the second clock frequency is 80 MHz. In other embodiments, the method includes clock signal generating methods discussed above with reference to FIGS. 4-6. Of course, there can be other variations, modifications, and alternatives.

In a specific embodiment, the method adds (step 840) a multiplexer circuit for selecting a master clock signal from the first and the second clock signals in response to a clock-selection control signal. In an embodiment, the method also includes providing a state machine which includes a user mode state, a test mode state, and a high-clock-frequency state. The state machine is configured to enter the test mode state in response to an input command signal. The state machine enters the high frequency state from either the user mode state or the test mode state in response to a high-clock frequency command. The method also includes providing a command decoder configured to issue the clock-selection control signal when the state machine is in the high-clock-frequency state. In an embodiment, the method (step 850) provides a command register for receiving the master clock signal and issuing the clock-selection control signal. In a specific embodiment, the method also (step 860) provides an address register for receiving the master clock signal and providing a memory address to the memory array. In an embodiment, the method provides (step 870) an output register for receiving an output data from the memory array in response to the master clock signal. Of course, there can be other variations, modifications, and alternatives.

The above sequence of steps provides a method for making a memory device capable of being operated at a high-clock-frequency according to an embodiment of the present invention. As shown, the method uses a combination of steps including a way of generating a high frequency internal clock in the memory device from an input clock signal. Other alternatives can also be provided where steps are added, one or more steps are removed, or one or more steps are provided in a different sequence without departing from the scope of the claims herein.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for wafer-level testing of serial flash memory devices, the method comprising:
   providing a memory tester operable in a clock frequency range from 30 to 100 MHz;
   providing a semiconductor wafer comprising a first plurality of serial flash memory devices, each of the first plurality of serial flash memory devices including a plurality of bonding pads for accessing internal circuits of the memory devices;
   selecting a second plurality of serial flash memory devices from the first plurality of serial flash memory devices;
   subjecting one or more of the second plurality of serial flash memory devices to a first clock signal from the memory tester;
   receiving a command signal at a bonding pad from the plurality of bonding pads from one of the second plurality of serial flash memory devices for activating a high-clock-frequency test mode;
   generating a second clock signal in the memory device in response to the first clock signal, the second clock signal being characterized by a second clock frequency which is a multiple of the first clock frequency; and
   testing the second plurality of memory devices at the second clock frequency.

2. The method as recited in claim 1, wherein the generating of the second clock signal further comprises:
   receiving a third clock signal from the memory tester, the third clock signal being characterized by the first clock frequency, the third clock signal being also characterized by a ¼ cycle phase shift with respect to the first clock signal; and
   coupling the first and third clock signals to an EXCLUSIVE-OR circuit, the EXCLUSIVE-OR circuit being configured for generating the second clock signal, the second clock signal being characterized by a clock frequency that is twice the first clock frequency.

3. The method as recited in claim 2, wherein the testing of the second plurality of serial flash memory device comprises:
   programming data patterns into memory cells of each of the second plurality of serial flash memory devices;
   reading the memory cells to verify the data patterns;
   erasing the memory cells in each of the second plurality of serial flash memory devices; and
   issuing commands to the memory device to verify user mode and test mode operations.

4. The method as recited in claim 2, wherein the second clock frequency is in the range of 60 to 200 MHz.

5. The method as recited in claim 4, wherein the first clock frequency is 40 MHz and the second clock frequency is 80 MHz.

6. The method as recited in claim 1, wherein the generating of the second clock signal further comprises:
   coupling the first clock signal to a PLL circuit for producing a second clock signal, the second clock signal being characterized by a clock frequency which is twice the clock frequency of the first clock signal.

7. The method as recited in claim 1, wherein the generating of the second clock signal further comprises:
   generating a fourth clock signal in response to a rising edge of the first clock signal;
   generating a fifth clock signal in response to a falling edge of the first clock signal; and
   combining the fourth and fifth clock signals to produce the second clock signal, the second clock signal being characterized by a clock frequency which is twice the clock frequency of the first clock signal.

8. A method for wafer-level testing of serial flash memory devices, the method comprising:
   providing a memory tester operable in a predetermined clock frequency range;
   providing a semiconductor wafer comprising a first plurality of serial flash memory devices, each of the first plurality of serial flash memory devices including a plurality of bonding pads for accessing internal circuits of the memory devices;
   selecting a second plurality of serial flash memory devices from the first plurality of serial flash memory devices;
   subjecting one or more of the second plurality of serial flash memory devices to a first clock signal from the memory tester;
   receiving a command signal at a bonding pad from the plurality of bonding pads from one of the second plurality of serial flash memory devices for activating a high-clock-frequency test mode;
   generating a second clock signal in response to the first clock signal, the second clock signal being characterized by a second clock frequency which is a multiple of the first clock frequency; and
   testing the second plurality of memory devices at the second clock frequency.

9. The method as recited in claim 8, wherein the generating of the second clock signal further comprises:
   receiving a third clock signal from the memory tester, the third clock signal being characterized by the first clock frequency, the third clock signal being also characterized by a ¼ cycle phase shift with respect to the first clock signal; and
   coupling the first and third clock signals to an EXCLUSIVE-OR circuit, the EXCLUSIVE-OR circuit being configured for generating the second clock signal, the second clock signal being characterized by a clock frequency that is twice the first clock frequency.

10. The method as recited in claim 8, wherein the testing of the second plurality of serial flash memory device comprises:
    programming data patterns into memory cells of each of the second plurality of serial flash memory devices;
    reading the memory cells to verify the data patterns;
    erasing the memory cells in each of the second plurality of serial flash memory devices; and
    issuing commands to the memory device to verify user mode and test mode operations.

11. A method for testing a memory device, the method comprising:

providing a memory tester capable of generating a first clock signal characterized by a first clock frequency;

applying the first clock signal to the memory device;

receiving a command for activating a high-clock-frequency test mode;

generating a second clock signal in the memory device in response to the first clock signal, the second clock signal being characterized by a second clock frequency higher than the first clock frequency; and testing the memory device at the second clock frequency.

12. The method as recited in claim 11, wherein the testing of the memory device comprises testing a serial flash memory device, the serial flash memory device including a plurality of memory cells.

13. The method as recited in claim 12, wherein the receiving of the command for activating a high-clock-frequency test mode further comprises:

receiving a high voltage signal at an input pin, the high voltage signal being characterized by a voltage substantially higher than an operating voltage of the memory device;

setting the memory device in a test mode; and activating the high-clock-frequency test mode in response to the high frequency test command in the test mode.

14. The method as recited in claim 12, wherein the receiving of the command for activating a high-clock-frequency test mode further comprises:

receiving a high voltage signal at an input pin with the memory device in a test mode, the high voltage signal being characterized by a voltage substantially higher than an operating voltage of the memory device; and activating the high-clock-frequency test mode in response to the high-frequency signal.

15. The method as recited in claim 12, wherein the testing of the memory device comprises:

programming data patterns into the memory cells;

reading memory cells to verify the data patterns;

erasing memory cells in the memory devices; and issuing commands to the memory device to verify user mode and test mode operations.

16. The method as recited in claim 11, wherein the generating of the second clock signal further comprises:

receiving a third clock signal from the memory tester, the third clock signal being characterized by the first clock frequency, the third clock signal being also characterized by a ¼ cycle phase shift with respect to the first clock signal; and coupling the first and third clock signals to an EXCLUSIVE-OR circuit, the EXCLUSIVE-OR circuit being configured for generating the second clock signal, the second clock signal being characterized by a clock frequency that is twice the first clock frequency.

17. The method as recited in claim 11, wherein the generating of the second clock signal further comprises:

coupling the first clock signal to a PLL circuit for producing a second clock signal, the second clock signal being characterized by a clock frequency which is twice the clock frequency of the first clock signal.

18. The method as recited in claim 11, wherein the generating of the second clock signal further comprises:

generating a fourth clock signal in response to a rising edge of the first clock signal;

generating a fifth clock signal in response to a falling edge of the first clock signal; and combining the fourth and fifth clock signals to produce the second clock signal, the second clock signal being characterized by a clock frequency which is twice the clock frequency of the first clock signal.

19. The method as recited in claim 11, wherein the first clock frequency is 40 MHz and the second clock frequency is 80 MHz.

* * * * *